United States Patent [19]
Loopik et al.

[11] Patent Number: 5,381,417
[45] Date of Patent: Jan. 10, 1995

[54] CIRCUIT TESTING SYSTEM

[75] Inventors: Alex Loopik, Rijswijk, Netherlands; David T. Crook, Loveland, Colo.

[73] Assignee: Hewlett Packard Company, Palo Alto, Calif.

[21] Appl. No.: 8,472

[22] Filed: Jan. 25, 1993

[30] Foreign Application Priority Data

Feb. 25, 1992 [EP] European Pat. Off. ............ 92301573

[51] Int. Cl.6 ............................................. G06F 15/20
[52] U.S. Cl. ................................ 371/15.1; 364/579; 364/578; 371/22.1
[58] Field of Search ............. 364/579, 580; 371/15.1, 371/22.1, 27

[56] References Cited

U.S. PATENT DOCUMENTS

| | | | |
|---|---|---|---|
| T924,006 | 7/1974 | Chia et al. | 371/22.1 |
| T930,005 | 1/1975 | Chia et al. | 371/22.1 X |
| 4,168,796 | 9/1979 | Fulks et al. | 371/22.6 |
| 4,194,113 | 3/1980 | Fulks et al. | 371/22.4 |
| 4,454,585 | 6/1984 | Ele | 364/507 |
| 4,709,366 | 11/1987 | Scott et al. | 371/29.1 |
| 4,857,833 | 8/1989 | Gonzalez et al. | 324/512 |
| 5,001,714 | 3/1991 | Stark et al. | 371/26 |
| 5,010,522 | 4/1991 | Dias et al. | 371/27 |
| 5,157,668 | 10/1992 | Buenzli et al. | 371/15.1 |
| 5,293,323 | 3/1994 | Doskocil et al. | 364/551.01 |

FOREIGN PATENT DOCUMENTS

| | | |
|---|---|---|
| 2619926 | 3/1989 | France . |
| 2055478 | 3/1981 | United Kingdom . |
| 2209224 | 1/1992 | United Kingdom . |

OTHER PUBLICATIONS

Cassas, "Portable Tester Learns Boards to Simplify Service", Electronics, Jun. 16, 1981, pp. 153–160.

*Primary Examiner*—Edward R. Cosimano

[57] ABSTRACT

The present invention relates to the field of circuit assembly testing systems and provides improved systems and methods for debugging circuit test systems and diagnosing faults in circuit assemblies. An expert system derives possible root causes of test failures, predicts test results based on these possible root causes and uses factual observations to refute inconsistent hypothetical root causes. Tests useful in refuting inconsistent hypothetical root causes are devised and run automatically by the system.

15 Claims, 8 Drawing Sheets

CIRCUIT TESTING SYSTEM

FIELD OF THE INVENTION

The present invention relates to the technical field concerned with the testing of circuit assemblies. The term 'circuit assembly' is meant to cover a circuit board and also to cover smaller assemblies of components, such as multi-chip modules, designed to be mounted on a circuit board. The present invention is applicable both to the debugging of systems for testing circuit assemblies and to the testing and diagnosis of faults in circuit assemblies. In the case of debugging circuit test systems, the assumption is that the circuit assembly being used is fault-free. In the case of the testing and diagnosis of faults in circuit assemblies the assumption is that the testing system is fault-free. The invention is applicable to test environments for 'in-circuit' testing of analogue or digital circuit assemblies and to test environments for 'functional' testing of analogue or digital circuit assemblies. By 'in-circuit' testing is meant testing of individual analogue components or integrated circuit chips in position in a circuit assembly. By 'functional' testing is meant testing of groups of analogue components or integrated circuit chips in position in a circuit assembly.

BACKGROUND OF THE INVENTION

Before a circuit assembly is sold by its manufacturer or is incorporated into a larger assembly, it needs to be tested. The circuit assembly can either simply be tested as to whether it passes or fails predetermined tests or additionally if the circuit assembly fails, diagnosis can be carried out to ascertain the cause(s) of test failure. In any case there is a need for a reliable test environment-one which will consistently pass good circuit assemblies and fail faulty ones.

There are several known circuit assembly test systems. One known test system will be described with reference to FIGS. 1-4 of which:

FIG. 1 is a diagrammatic representation of a known test system;

FIG. 2 is a perspective view of the known test system of FIG. 1;

FIG. 3 is a section of part of the testhead of the known test system of FIGS. 1 and 2;

FIG. 4 represents the known debugging process.

A known test system shown in FIG. 1 is for in-circuit testing of analogue circuit assemblies. The known test system 10 comprises:

- a data base 12 for storing data concerning the topology of a circuit assembly 14, say a printed circuit board 14, to be tested;
- a test program generator 16 for generating tests for each of the components on the board 14 and for specifying the hardware set-up required to test the board 14:
- a test program controller 18 for causing tests to be performed and for evaluating and outputting test results;
- a test hardware module 20 for generating test signals and applying these to the board 14;
- an in-circuit test device or 'fixture' 22 which is configured for the particular board under test and to which the board 14 is electrically connected during testing. In this embodiment, the fixture 22 is vacuum-sealed to the board 14 although other fixing methods can be used.

The database 12 includes data on the analogue component descriptions, the board topology and physical dimensions as well as test strategy data such as the duration of tests and the degree of precision to which specific components need to be tested. The test program generator 16 uses the data in the database 12 to generate a suite of tests for the board 14. In addition, the test program generator 16 generates a specification for the set-up of the test hardware module 20 and the fixture 22 for applying the tests to the board 14.

The function of the fixture 22 is to interconnect every potential circuit node on the board 14 to the fixed sockets in the test hardware module 20 as will be described more fully with reference to FIG. 3.

FIG. 2 shows the system 10 in perspective and the silhouette of a notional user. The system 10 is one of the HP3070 family of circuit assembly test systems made and sold by the applicant, and comprises:

- a tiltable housing 30 mounted on a supporting cradle 31 and supporting a test head 32 to be more fully described with reference to FIG. C. The housing 30 contains the test hardware module 20;
- a rack 33 including supply and distribution power units;
- a controlling computer 34, a monitor 36, a keyboard 38 and a mouse 40;
- a printer 42 pivotally attached to the supporting frame 31;
- a guided probe 44 located next to the testhead 32 in a probe holder.

The housing 30 is tillable through 90 degrees to a position to suit the user. The rack 33 contains a power supply unit for supplying dc voltages to testhead 32. Where different testheads are to be used, there is a power supply unit for each one. The rack 33 also contains a power distribution unit for distributing various ac and dc voltages to different parts of the system. The rack 33 further contains a power supply unit for supplying power to each circuit assembly which can be tested by the system 10. The computer 34 is a workstation which provides the user interface to the system 10 to enable the user to monitor and control the debugging process. The guided probe 44 enables the user to verify fixture wiring and carry out other manual checks. A section through part of the testhead 32 is shown in FIG. 3. The board 14 under test sits on a support plate 45 provided with side stops 46 to support and position the board 14. The fixture 22 is within a vacuum-sealable casing 47 which supports the support plate 45 on a spring seal 48. The fixture 22 itself comprises upper and lower plates—a probe plate 49 and an alignment plate 50. The alignment plate 50 comprises a conical aperture 52 aligned with each of the interface pins 53 on the testhead 32. The underside of the probe plate 49 of the fixture 22 comprises a pin 51 aligned with each of the conical apertures 52 in the alignment plate 50.

The pins 51 can bend to reach the apertures 52 if necessary as shown for the rightmost pin 51 in FIG. 3. Probes 54 extend through the probe plate 49 and the support plate 45 to make electrical contact with the board 14. A wire 55 electrically interconnects each of the probes 54 with a pin 51. The probes 54 may be provided with tulip heads for more reliable connection to protruding wires on the board 14. In FIG. 3 the right most probe 54 has a tulip head 55 for connecting to a lead from a component 56 on the board 14. Tooling pins 57 register the fixture 22 with the support plate 45 and the board 14.

For testing purposes, the cavity 58 is evacuated via vacuum ports 59 to vacuum seal the board 14 to the fixture 22.

Circuit assembly data may be supplied to the system 10 in electronic form, for example the output of a computer-aided design system. The test program generator produces a fixture specification and wiring diagram for implementation by the human test operator. The implementation of the test hardware set-up is a skilled and laborious process but is well-known and will not be described in detail here.

The test program generator 16 calculates where probes 54 are needed to test the components on the board 14 to the test strategy specification. As well as probes for permitting the supply of a test voltage and the detection of test measurements, further probes termed 'guard probes' may be needed to help isolate the component under test from its environment.

The test program controller 18 configures the test hardware module 20 to apply the test signals in accordance with the test strategy devised by the test program generator 16. During testing, the test program controller 18 controls a sequence of tests being applied to the board 14 according to the suite of test scripts generated by the test program generator 16. The measurements obtained are supplied to the test program controller 18 which assesses which tests pass and which tests fail on the basis of threshold values supplied by the test program generator 16 and stores the results. When a suite of tests is complete, the results are output in printed form.

Before putting a test system into active service for testing a particular model of circuit assembly, the test system itself needs to be tested or 'debugged'. This involves carrying out testing on a 'known good circuit assembly' i.e. one which is thought to be fault-free. The objective of the debugging stage is to find and correct faults in the testing procedures and equipment themselves. In practice there are usually some faults in the test system and the majority of these are caused by errors in the data in the circuit assembly database 12. Consequently verification of this data is a key aspect of debugging the test system.

Correct circuit assembly and test-strategy data are also important for the implementation and addition of new tests to a circuit assembly test suite to take account of later revisions to an assembly. Ideally the modifications to the circuit assembly are changed in its representation in the circuit assembly database 12 and an incremental run of the test program generator 16 adapts the test programs and the fixture 22 is altered where necessary. This process counts on the correctness of the already present circuit assembly data.

Other sources of test failure are physical failures (on the supposed 'known good circuit assembly', in the fixture 22 or in the test hardware module 20) and faults inherent in the test system 10 i.e. even with faultless data, the test program generator 16 may not generate wholly appropriate tests.

The process of debugging the test system is distinguished from two other activities that are carried out later in the overall test development process: test optimization and preparation for production. Test optimization aims to shorten the time it takes to run a test suite. In preparation for production, the test suite is run on a representative sample of circuit assemblies for further fine tuning of the tests.

At present what happens in practice during the debugging stage is shown in FIG. 4. Therein it can be seen that a human test developer causes the test system 10 to run the automatically-generated suite of tests once on a known good circuit assembly. A failure list is automatically generated specifying every test which failed by giving the measured and nominal value of the component under test and the high and low tolerances of the test. An example could be ---
RESISTOR 10: Nominal value 1000 ohms +−5%
Measured value 500 ohms
---

The human test developer tries out changes in the test program which have worked previously, evaluates the results and implements the change that appears best.

There are serious problems inherent in the existing approach to debugging circuit assembly test systems:
i) it is a skilled and time-consuming operation;
ii) lack of sufficient expertise has meant that non-optional test suites are generated;
iii) the root causes of test failures are not evaluated and addressed.

This can mean:
that physical defects are masked e.g. a bad guard probe contact can be 'fixed' by increasing the nominal test value or widening the tolerance;
ii) deficiencies in the data in the circuit assembly database 12 remain—this can mean that other tests which passed should really have failed and also means that faulty data forms the basis for new tests generated to take account of later circuit assembly revisions.

Once a circuit testing system is in operational use for testing circuit assemblies, test failures imply that the circuit assembly under test is faulty. Once again, it can be important to locate the root cause of test failure rather than simply implementing the fix that appears to work the best. It has been found that a large proportion of test failures is due to incorrect positioning of the circuit assembly on the fixture and/or insufficient contact between the test probes and the circuit assembly.

In the case of a production line, the diagnosis of faults in circuit assemblies is normally done off-line.

It is known to use expert systems in the field of diagnosing faults in circuit assemblies although these expert systems are either case-based or completely heuristic. No systems for debugging circuit test systems employing expert systems are known.

SUMMARY OF THE INVENTION

The present invention aims to address some of the problems with known methods and apparatus for testing circuit assemblies.

According to a first aspect of the present invention we provide apparatus for testing circuit assembly comprising:
means for storing data relating to the topology of a circuit assembly;
means for storing testing data;
means for performing tests on said circuit assembly and storing the test results:
means for generating and storing possible causes of test failures;
means for predicting test results assuming said possible causes of test failure;

means for maintaining consistency between observed test results and predicted test results, and means for indicating possible causes of test failure which are consistent with observed test results.

An advantage of the present invention is that it derives the possible root causes of test failure and notifies the test operator of these thereby saving time and improving the quality of the test process.

Preferably, the invention provides means for devising further tests for evaluating said predicted test results and means for performing one or more of said further tests wherein said consistency maintaining means is operable to eliminate ones of said stored possible root causes of test failure which are not consistent with the results of said further tests. In the embodiment to be described, these further tests are carried out automatically where possible and there are means for indicating to a user further useful manual tests.

Whilst it may be possible to generate root cause hypotheses from the initial test results, to predict test results assuming these root causes of test failure and to refute one or more of the predicted test results on the basis of the initial test results, it is advantageous to be able to devise further tests in order to refute as many root cause hypotheses as possible.

Optionally, the possible root causes may be ranked according to their relative probability when indicated to the user. This feature helps to guide the test opertor in the order in which the remaining possible root causes are investigated. A further option is to provide means for automatically effecting a change to data and/or steps used to test the circuit assembly in order to remove a possible cause of test failure. This feature is relevant to the debugging of circuit test systems in which case the root cause of a test failure may be susceptible to being remedied automatically e.g. by altering the board topology data or reprogramming certain test steps.

According to a second aspect of the present invention we provide an expert system for use with circuit assembly test equipment, said equipment comprising:

means for storing data relating to the topology of a circuit assembly;

means for performing tests on said circuit assembly and storing the test results, said expert system comprising:

means for generating and storing possible causes of test failure;

means for predicting and storing test results assuming said possible causes of test failure;

means for maintaining consistency between obtained test results and predicted test results, and means for indicating possible causes of test failure which are consistent with obtained test results.

Preferably, the expert system comprises means for devising further tests for evaluating said predicted test results and means for storing the results of said further tests wherein said consistency maintaining means is operable to eliminate ones of said possible causes of test failure which are not consistent with the results of said further tests. The expert system may be operable to rank the possible root causes according to their relative probability.

According to a third aspect of the present invention we provide a method of testing circuit assemblies using a computerised system for testing circuit assemblies comprising means for storing data relating to the topology of a circuit assembly and means for storing testing data comprising the following steps:

(a) performing tests on said circuit assembly and storing the test results;

(b) generating and storing possible causes of test failures;

(c) predicting and storing test results assuming said possible causes of test failure;

(d) maintaining consistency between obtained test results and predicted test results, and (e) indicating possible causes of test failure which are consistent with obtained test results.

The method preferably further comprises the steps of;

(a) devising further tests for evaluating said predicted test results;

(b) performing one or more of said further tests;

(c) eliminating ones of said stored possible causes of test failure which are not consistent with the results of said further tests.

Where possible, it is preferred that said further tests are done automatically. The method optionally comprises ranking possible causes of test failures according to their relative probablities. A further optional step is automatically effecting a change to data and/or steps used to test the circuit assembly in order to remove a possible cause of test failure.

BRIEF DESCRIPTION OF DRAWINGS

A specific embodiment of the present invention will now be described, by way of example, with reference to the accompanying drawings in which.

DETAILED DESCRIPTION OF THE INVENTION

A specific embodiment of the present invention in the context of debugging a circuit test system will now be described.

Figure 1:
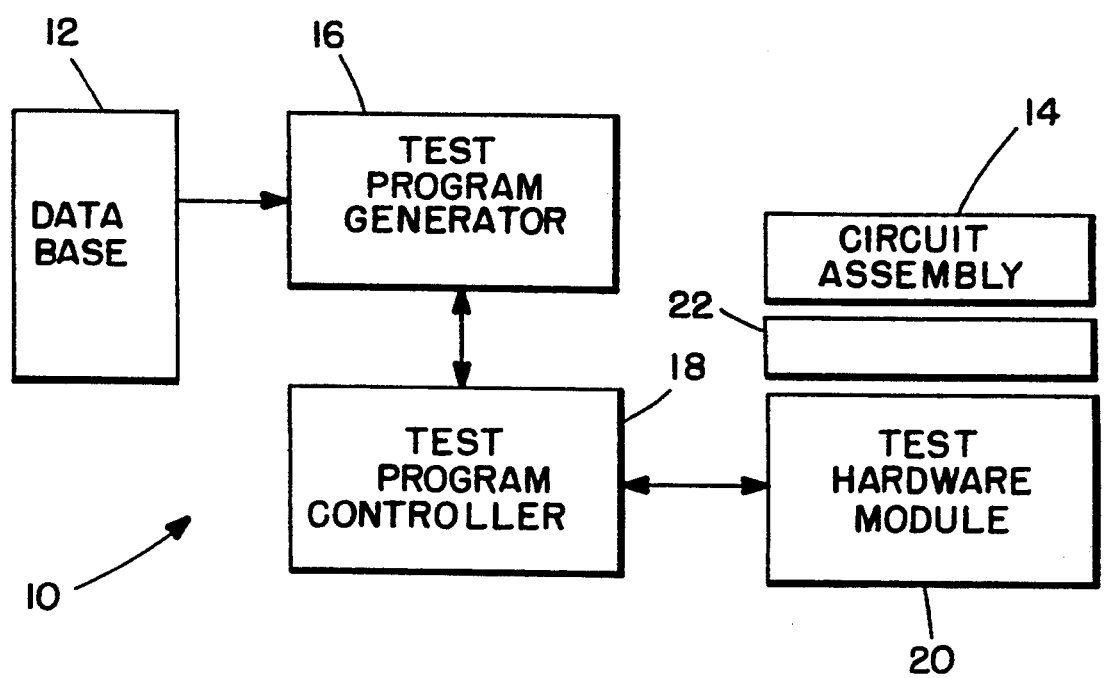
FIG. 1 is a diagrammatic representation of a known test system.
Figure 2:
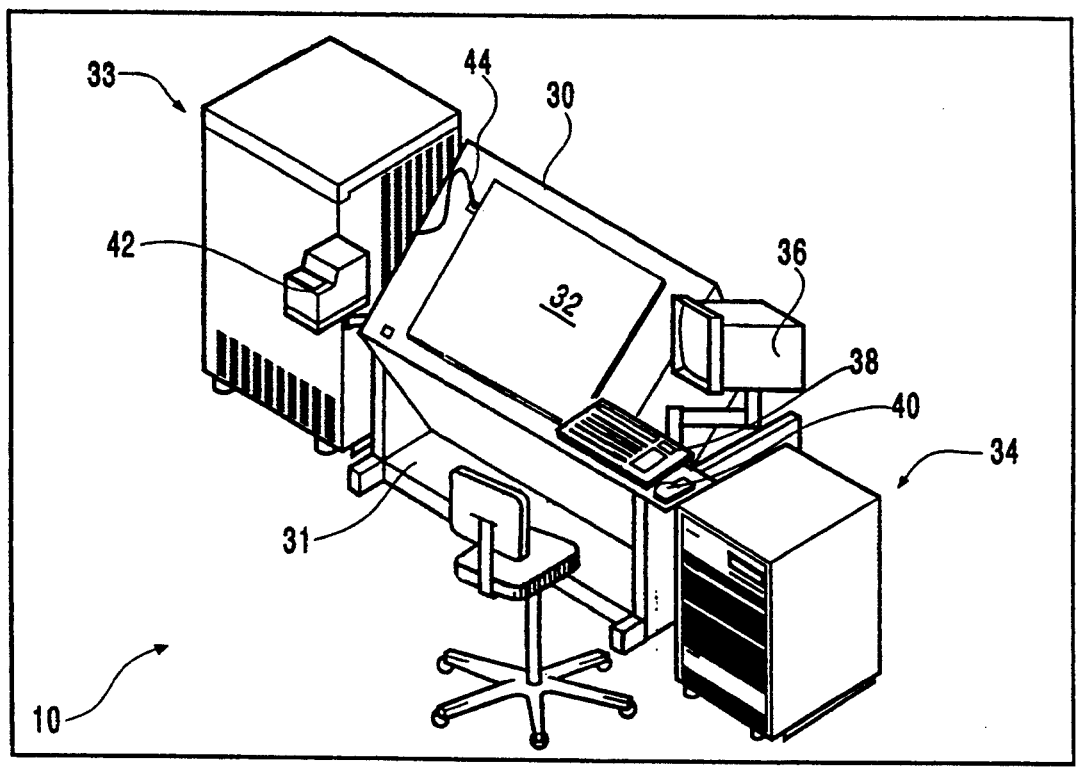
FIG. 2 is a perspective view of the known test system of FIG. 1.
Figure 3:
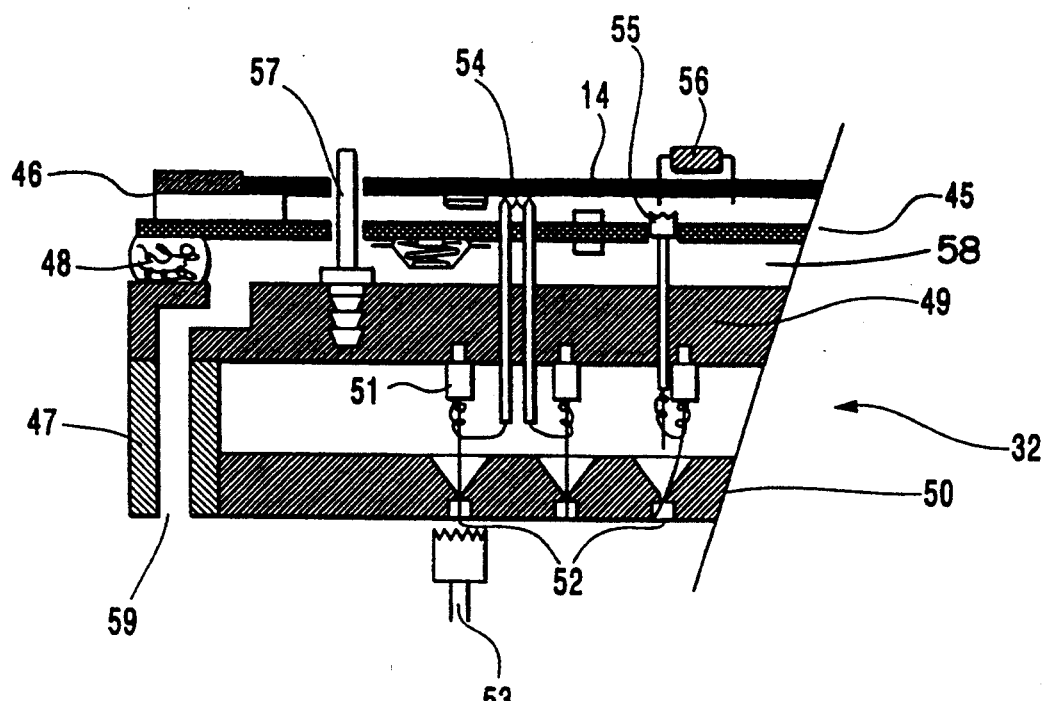
FIG. 3 is a section of part of a test head of the known test system of FIGS. 1 and 2.
Figure 4:
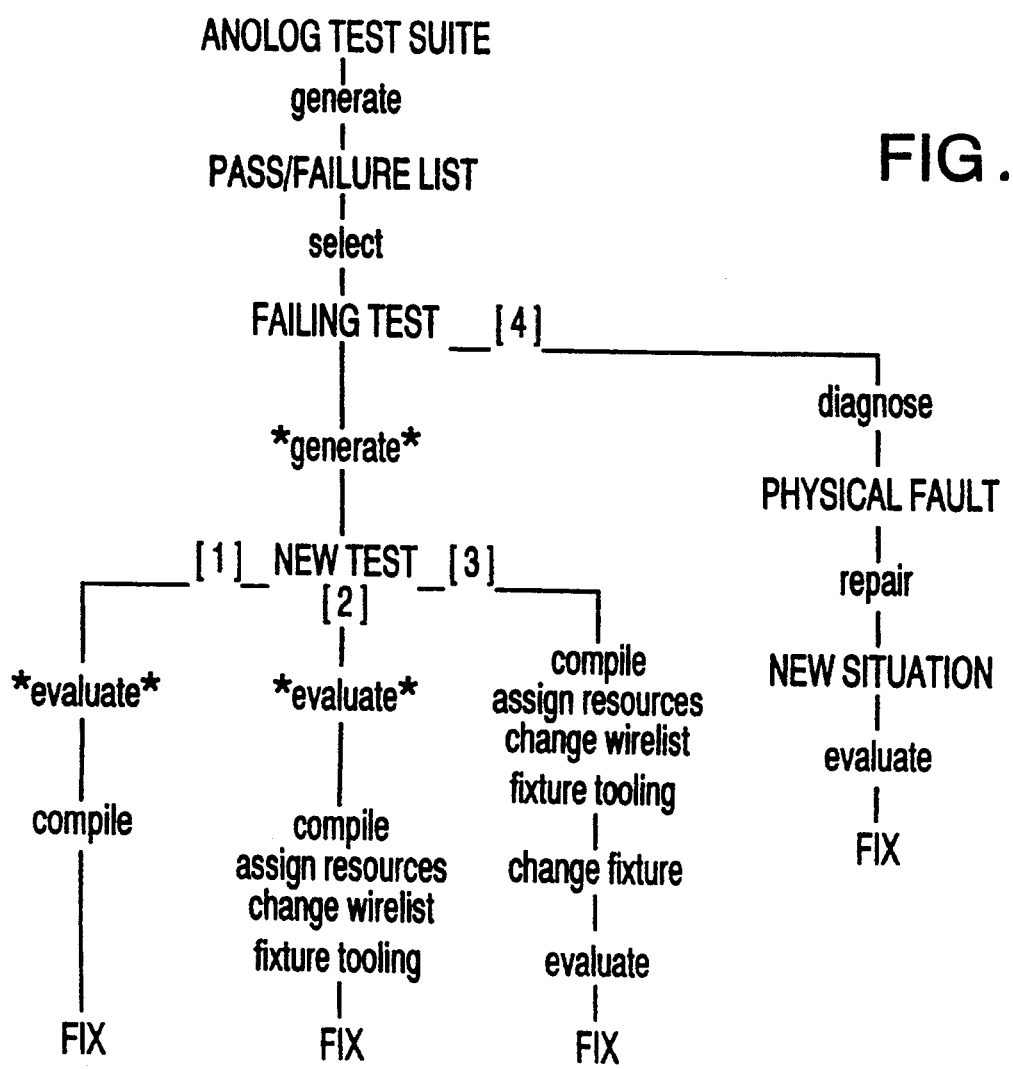
FIG. 4 represents a known debugging process.
Figure 5:
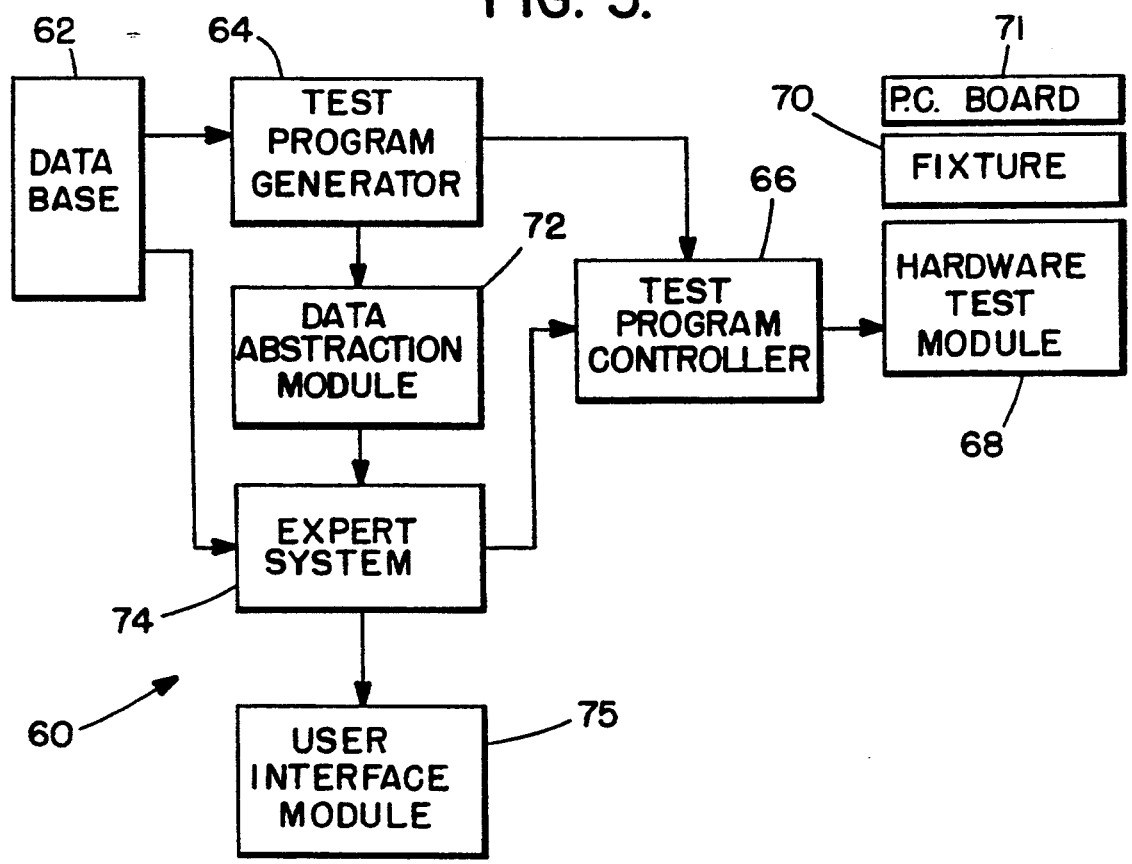
FIG. 5 is a block diagram of a test system embodying the present invention.

Referring to FIG. 5 a test system 60 comprises:

a database 62 for storing data concerning a circuit assembly to be tested;

a test program generator 64 for generating tests for each component in the circuit assembly and for specifying the hardware set-up required for each test;

a test program controller 66 for causing tests to be performed and recording the results;

a test hardware module 68 for generating stimulus signals and applying these to the circuit board under test and measuring the response signal;

a fixture 70 configured for testing a printed circuit board 71 under test and as described and shown in FIG. 1;

a data abstraction module 72 for transforming the test results recorded by the program controller 66 into a form which can be processed by an expert system;

an expert system 74 for predicting the cause of test failures, and a user interface module 75.

This specification discloses details of the approach used in the Hewlett-Packard HP 3070 circuit testing system which is commercially available. The terminology used is familiar to those skilled in the art. Some of the more important terms used have the following meanings:

a node is a circuit node on the board under test on which a test probe can be placed.

the S_node, L_node and G_node denote respectively the nodes to which the test signals are supplied, the node from which the readings to provide input to the test hardware module 68 is taken and the node to which a guard probe is applied during the test.

A two-wire test is one where only supply and input probes are used and a three-wire test is where a guard probe is also used.

Throughout, the term 'test results' is used to cover all types of test or measurement or other observation relating to a circuit assembly. No attempt has been made to distinguish between production type tests and other measurements which would not normally be made during production testing.

The database 62 stores the following board data:
connections(Node, List_of_devices) |

| device (Device, List_of_nodes) | ; for every Device except the<br>; the type library, which is<br>; covered by the<br>; library component data. |
| --- | --- | resistor(Device, Value, Tol+, Tol−, Device_type) |
capacitor(Device, Value, Tol+, Tol−, Device_type) |
inductor(Device, Value, Tol+, Tol−, Series_R, Device-type) |
library(Device, Library-type) |
diode(Device, Hi-value, Low-value) |
transistor(Device, Hi_beta, Low_beta, Transitor-type) |
fet(Device, Hi_res, Lo_res, Fet-type) |
jumper(Device, Closed_or_open) |
fuse(Device) |
connector(Device) |
potentiometer(Device, Value, Tol+, Tol−) |
Switch(Device, Common_node, Contact) |
zener(Device, Value, Tol+, Tol−) |
cluster(Device, Library_type) |
internal_structure(Parent_device, List_of_devices) |
Power_nodes(List_of_nodes)
ground_node(Node).

In which the following datatypes are used:

| Value | ::= | Number. |
| --- | --- | --- |
| Tol+ | ::= | Number. |
| Tol− | ::= | Number. |
| Series_R | ::= | Number. |
| Hi_value | ::= | Number. |
| Low_value | ::= | Number. |
| Hi_beta | ::= | Number. |
| Low_beta | ::= | Number. |
| Node | ::= | Quoted-unique-atom; a uniquely identifiable string. |
| Device | ::= | Quoted_unique_atom. |
| Common_pin | ::= | Node |
| Contact | ::= | Node ¦ off. |
| Parent_device | ::= | Device. |
| Device_type | ::= | fixed ¦ variable. |
| Transistor_type | ::= | npn ¦ pnp. |
| Fet_type | ::= | n_channel ¦ p_channel. |
| Closed_or_open | ::= | open ¦ closed. |
| Library_type | ::= | analog ¦ digital mixed¦ part ¦ undefined. |
| List_of_nodes | ::= | list of Node. |
| List_of_devices | ::= | list of Device. |

The form of the data generated by the test program generator 64 is as follows:

Test_code_data ::=
test_device(Test, Device, Test_type) |
test_nodes( Test, S_node, I-node, List_of_G_nodes) |
test_sens_nodes(Test, A_node, B_node, L_node |
capacitor_test_values_(Test, Value, Tol+, Tol−) |
diode_test_values_(Test, Hi_value, Low value) |
fuse_test_values(Test, Threshold) |
inductor_test_values(Test, Value, Tol+, Tol−) |
jumper_test_values(Test, Threshold) |
nfetr_test_values(Test, Hi_value, Low_value) |
npn_test_values(Test, Hi_value, Low_value) |
pfetr_test_values(Test, Hi value, Low value) |
pnp_test_values(Test, Hi_value, Low_value) |
potentiometer_test_values(Test, Value, Tol+, Tol−) |
resistor_test_values(Test, Value, Tol+, Tol−)
switch_test_values(Test, Threshold) |
zener_test_values(Test, Value, Tol+, Tol−) |
capacitor_test_options(Test, List_of_options) |
diode_test_options(Test, List_of_options) |
fuse_test_options(Test, List_of_options) |
inductor_test_options(Test, List_of_options) |
jumper_test_options(Test, List_of_options) |
nfetr-test-options(Test, List-of-options) |
npn-test-options(Test, List-of-options) |
pfetr test options(Test, List-of-options) |
pnp test options(Test, List-of-options) |
potentimoeter-test-options(Test, List-of-options) |
resistor-test-options(Test, List-of-options) |
switch-test-options(Test, List-of-options) |
zener-test-options(Test, List-of-options) |

In which the following new datatypes are used:

| Test | ::= | Quoted_unique-atom. |
| --- | --- | --- |
| Threshold | ::= | Number. |
| Test-type | ::= | capacitor ¦ diode ¦ fuse inductor ¦ jumper ¦ nfetr ¦ npn ¦ pfetr pnp potentiometer ¦ resistor ¦ switch ¦ zener. |
| -S_node | ::= | Node. |
| -L_node | ::= | Node. |
| -List_of_G_nodes | ::= | list of Node. |

```
-A_Node              ::= Node.
-B_Node              ::= Node.
-L_Node              ::= Node.
List_of_options      ::= list of Option
Option               ::= ad(AD number) | am(Number) |
                         ar(Number) | co(Number) | comp |
                         ed | en | fi(Integer) |
                         fr(FR_number) |
                         idelta(Percentage) |
                         ico(Ico number) | idc(Number)
                         nocomp | of(Number) | op | pf | pm
                         re(RE-number) | sa | sb | sf | sm |
                         wa(Number) | wb.
Ico-number           ::= 0 | 1.
AD_number            ::= 1 | 2.
FR_number            ::= 128 | 1024 | 8192.
Percentage           ::= 0 ... 100.
RE_number            ::= 1 | 2 | 3 | 4 | 5 | 6.
```

Data specifying the configuration of the test hardware setup takes the following form:

```
Library_component_data ::=
library_in_pins(Device, List_of_IN_pins) |
library_out_pins(Device, List_of_OUT_pins) |
library_bidirectional_pins(Device, List_of_BIDI-
    RECTIONAL_pins) |
library_power_pins(Device, List_of_POWER_
    pins) |
library_nondigital_pins(Device, List of NON-
    DIGITAL_pins) |
library_undefined_pins(Device, List_of_UN-
    DEFINED_pins). |
device_family(Device, Family).
```

```
List_of-IN_pins              ::= list of Nodes
List_of_OUT_pins             ::= list of Nodes
List_of_BIDIRECTIONAL_pins   ::= list of Nodes
List_of_POWER_pins           ::= list of Nodes
List_of_NONDIGITAL_pins      ::= list of Nodes
List_of_UNDEFINED_pins       ::= list of Nodes
Family                       ::= | fet | diode | ...
```

The types of information stored in the database 62 and produced by the test program generator 64 are already known and are familiar to the person skilled in the art of circuit board testing technology and will therefore not be explained in further detail here.

The data abstraction module 72 is a procedural program for deriving higher level information from detailed test results. One such higher level feature is whether a particular test measurement is 'noisy' i.e. unreliable, or stable. To assess this quality the tests are repeated several times e.g. in three cycles of ten tests each. Between each cycle, the test probes are moved out of contact and then back into contact with the board. A test is noisy if its value varies significantly within a test cycle. Other examples of higher level features derived by the data abstraction module are:

test results (whether 'pass' or 'fail' and the type of fail
    e.g. fail-high, fail-low or fail-open)
measured value
standard deviation
probe contact noise The data abstraction module 72 is designed to select the worst case. Therefore if any test in a set of test cycles fails, then the test is classified as having failed, even if the majority of tests in the set of test cycles pass. In addition, the most serious type of test failure is selected if there is more than one. The measured value is the mean value of all the measurements obtained from a set of test cycles. The standard deviation is calculated according to a standard formula thereby eliminating the effect of probe noise. The probe contact noise is a measure of the variation between measured values obtained from different cycles in a given set of test cycles. It is true or false depending on the level of a predetermined threshold.

The syntax which will be used to express test specifications and measurements is as follows:

```
*BASIC TYPES:
Real.
Integer.
Quoted_unique_atom.
*DERIVED TYPES:
Number                      ::= Real | Integer.
OBSERVATIONS:
Observation                 ::= observed(Observation_name,
                                Result).
Observation_name            ::= Result ::=

For pin test:
pin_check_result(Node)          pass | fail
For every test:
test_result(Test)               fail_bogus | fail_open |
                                fail_high_and_low | fail_high
                                fail_low | pass
measured_value(Test)            Real
standard_deviation(Test)        Real
For failed tests:
measured_range(Test)            [Min, Max] ; Min, Max are real
order_of_magnitude_off(Test)    integer
ordinary_noise(Test)            true | false
probe_contact_noise(Test)       true | false
standard_value_(Test)           true | false | possible
percentage_off(Test)            real
```

The data abstraction module 72 includes program instructions which are component-specific but not board specific. For example the instructions for abstracting data obtained from testing a resistor can be used for any resistor on any board.

Further details of these program instructions are as follows:

1) test_result(Test)
Allowed value:
    pass, fail_high, fail_low, fail_high_and_low,
    fail_open, fail_bogus.

If the result of the test is either fail_open or fail_bogus, no further information will be supplied for this test.

The aim is to derive a single test result from each set of test cycles. The types of test result are prioritised in descending order of seriousness as follows:

```
-fail_bogus             ;any reading that is not a pass or fail
                        ;as defined by the log data.
-fail_open
-fail_high_and_low
-fail_high
-fail_low
-pass
```

The abstracted value which will be derived is the one which appears highest on the priority list and which is observed in the thirty measurements obtained from a set of test cycles. In this way, the most serious problems are addressed first.

The definitions of these possible test results are:
-fail_open: this identifies that there is an open circuit between the source and the input probes. It will be defined as operational amplifier output (v_moa) of less than 0.5 mV which can be recognised from the measured value by the following formula:

for resistors:
   true if grand_mean(Test)>200*nominal (Test) OR if the measured value measures<0
   false otherwise.

The idea is that the minimal "normal v-moa" (assuming an IPG written test) is 0.1 volt, which makes it at least 200 times the 0.5 mV threshold.

A similar definition is used for capacitors.

-fail_high_and_low: this is the case if some measurements fail high and others low (a noisy situation).

2) measured_value(Test)
Allowed value:
floating point number
Used for:
The absolute difference between nominal(Test) and grand_mean(Test) is used to calculate the possible values of intrinsics in parallel paths.
Definition:
grand_mean(Test) is the mean of all the 30 measurements 3) standard_deviation(Test)
Allowed value:
floating point number
Definition:
standard_deviation(Test)=average_sigma(Test)
This definition eliminates the effects of probe_noise.

4) ordinary_noise(Test)
Allowed values:
true, false
Used for:
concluding that a measurement is noisy.
Definition:
ordinary_noise(Test)=
   true if (6*average_sigma(Test))>high-low limit
   fail otherwise
The use of the average_sigma rather than the overall standard deviations means that any probe contact noise has no influence on this calculation.

5) standard_value(Test)
Allowed values:
true, false, possible
Used for:
evidence for a misload or a data entry in the board file for the nominal value
Definition:
The standard value ranges are as follows:

| | | | | | | | |
|---|---|---|---|---|---|---|---|
| 20% | 100 | 150 | 220 | 330 | 470 | 680 | (1000) |
| 10% | | 120 | 180 | 270 | 390 | 560 | 820 |
| 5% | 110 | 130 | 160 200 240 300 360 430 510 620 750 910 | | | | | | standard_value(Test) =
   true   if grand_mean(Test) is within 2% of 20% values(24%)
   possible  if grand_mean(Test) is within 1% of 10% values
         or 1% of 5% values (36%)
         false   otherwise   (40%)
                     (100%)

6) percentage_off(Test)
Possible values:
any floating point number
Useful for:
deciding if wrong tolerance is a possible root cause
Definition:
percentage_off(Test)=(abs(grand_mean(Test)-Nominal)/Nominal)*100
Other possibilities:

| -worst deviation from | -the nominal -high or low limit -mean of high and low limit |
|---|---|

7) measured_range(Test)
Allowed value:
[floating point number, floating_point_number]
Definition:
measured_range(Test)=minimum (measured_value(Test,Set)), maximum (measured_value(Test,Set)) (over all 3 sets)

8) order_of_magnitude_off(Test)
Allowed value:
real
Definition:
order_of_magnitude_off(Test)=intof(abs(log (grand_mean(Test)/nominal)))

9) pin_check_result(Node)
Allowed value:
Pass, fail
Used for:
refuting no_probe_connection
Definition:
pin_check result(Node)=pass if the pin passes pin_check
fail otherwise
The pin checking procedure is for checking the presence of a pin.

10) probe_contact_noise (Test)
Allowed values:
true, false
Used for:
concluding that a probe contact is noisy.
Definition:
probe_contact_noise(Test)=true if there exists a set S for which:
   abs(set_mean(Test,S)-grand_mean(Test))>(2*lead_resistance+(3*set_sigma (Test,S)/sqrt(10))
false otherwise
where
   lead_resistance is the common_lead_resistance from BOARD
The formula is based on:
sigma(set_means)=sigma(total)/sqrt(sample_size)
so set_sigma(Test, S)/sqrt(10) is used as an estimator for the sigma of the set_means.

Figure 6:
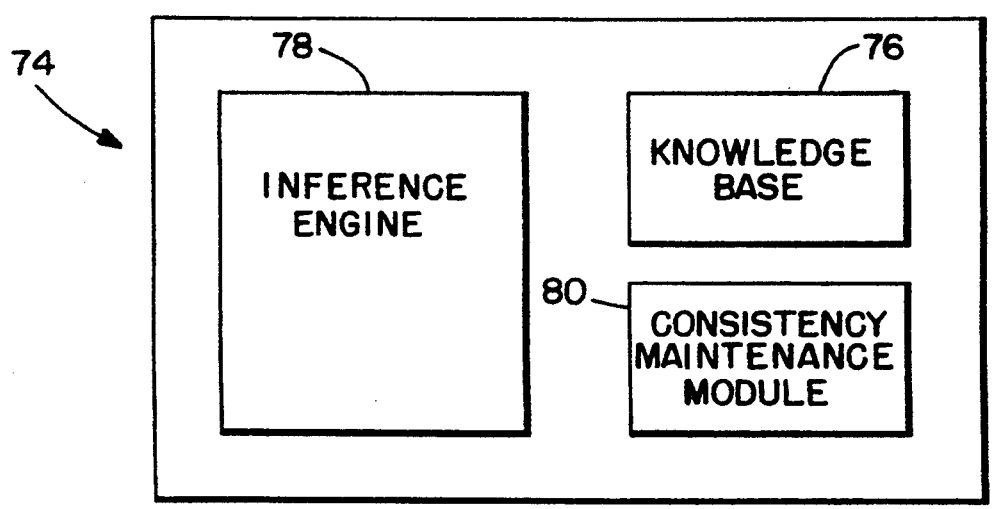
FIG. 6 shows the elements of the expert system of FIG. 5.

FIG. 6 shows the elements of the expert system. The expert system 74 comprises:
   a knowledge base 76 storing a causal model for establishing the root causes of test failures;
   an inference engine 78 for utilising the knowledge base 76 to process incoming data;
   a consistency maintenance module 80 for maintaining only those possible root causes which are consistent with test data obtained.

The art of building expert systems is now reasonably well developed and understood by the person skilled in the art. Several tools are commercially available for writing expert systems—these tools normally include an inference engine and the developer adds domain-specific knowledge.

A useful reference text on building knowledge base systems is Crafting Knowledge Base Systems by Walters and Nielsen, published by Wiley-Interscience. Another useful reference text is "The Art of Prolog" by Sterling and Shapiro, published by MIT Press although by no means all expert systems are written using Prolog.

The knowledge base 76 contains a set of rules defining a causal model of the things that can go wrong when testing a circuit board. These rules are based on a combination of the mathematical theory of network analysis and expert knowledge. This is a generic model applicable to all circuit assemblies but there is a degree of customisation to the specific test environment.

The rules in the knowledge base 76 are written in a declarative rule language, such as Prolog. The rules can be divided into two main categories:
i) rules for generating root cause hypotheses
ii) rules for generating predicted test results.

The rules for generating root cause hypothesis can be further divided into three main categories:
i) rules for analysing the circuit
ii) rules for extracting premises
iii) rules for extracting root cause hypotheses The inference engine 78 is built on top of an interpreter, such as a Prolog interpreter supplied as part of the 'poplog' system from ISL Corporation, and operates to combine incoming test data with the data and rules stored in the knowledge base 76 to generate root cause hypotheses. The rules in the knowledge base 76 are parsed by the inference engine 78.

The consistency maintenance module 80 stores the hypotheses generated by the inference engine as assumptions and also stores the predictions. The consistency maintenance module 80 employs a 'label propagation' algorithm of the kind well-known in the field. Details of one such algorithm are given in the paper entitled "General Labelling Algorithm for Assumption-Based Truth Maintenance" by Johan de Kleer of the Xerox Pall Alto Research Center and published in Conference Title: AAAI 88. Seventh National Conference on Artificial Intelligence p. 188–92 vol. 1 and are herein incorporated by reference. The dependencies between the predictions and the root cause hypotheses on which they are based is recorded and maintained by the consistency maintenance module 80. In this way, if an observed test result does not agree with a predicted test result, the underlying root cause hypothesis/es can be refuted. For example, if the consistency maintenance module contains the prediction for a resistor that:

Standard_value(Test)=true and the observed test result is that:

Standard_value(Test)=false then the prediction and any root cause hypotheses underlying it can be discarded.

Figure 7:
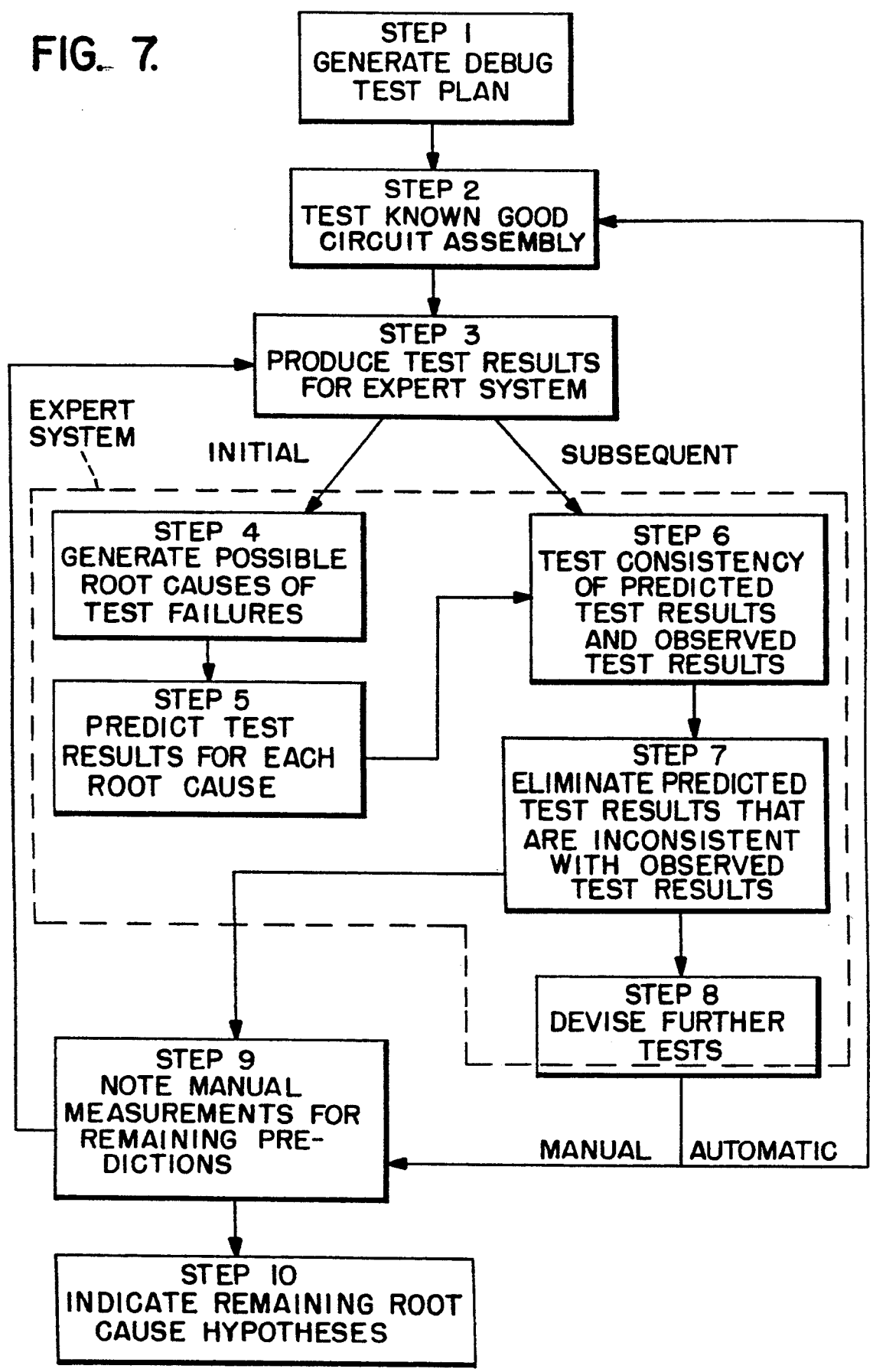
FIG. 7 depicts the steps in a method according to the present invention.

FIG. 7 gives an overview of a method according to the present invention. The steps performed by the expert system 74 are those contained within the dotted lines.

Initially a debug test plan is generated (STEP 1) and a 'known good' circuit assemply is tested (STEP 2) in a manner described above with reference to the prior art. The observations obtained from carrying out the test plan are processed (STEP 3) by the data abstraction module 72 to produce test results in a form which can be processed by the expert system 74. For failing tests, the expert system 74 is then invoked to generate possible root causes of test failure. Following this brief description of the operation of the expert system 74 is a more detailed description of the steps involved.

The next step is the generation (STEP 4) of possible root causes of test failures observed by running the debug test plan. For each 'root cause hypothesis', one or more test results are predicted (STEP5) which are consistent with that hypothesis. The consistency of these predicted test results with the test results observed when running the debug testplan is then checked (STEP 6). Any predicted test results which are inconsistent with observed test results are eliminated (STEP7) as are any root cause hypotheses which form the basis for these predictions. If any predicted test results remain, tests are devised (STEP8) to check these and such tests as are possible for the system to run automatically are performed (repeat STEP 2). Data obtained from performing these measurements is abstracted (repeat STEP 3) for processing by the expert system and the consistency of the test results obtained is checked (repeat STEP 6) against the remaining predictions. Inconsistent predictions are eliminated (repeat STEP 7) as are any root cause hypotheses which formed the basis for such predictions. If any predictions remain and there are manual measurements which can be made to check these, instructions for these measurements are displayed (STEP 9) to the user who performs the measurements (repeat STEP 2) and inputs the results. If there is more than one potentially useful manual measurement a list is generated prioritising the manual measurements, based on performance cost and the amount of new information expected to derive from the manual measurements. The test results obtained by the human test operator are fed back to the system via the user interface and are then treated in the same manner as just described for automatic measurements i.e. repeat STEPS 3, 6 and 7.

Once all possible further tests have been made, the remaining root cause hypotheses are indicated (STEP 10) to the user. The system 10 compiles a debug report including the output from the expert system 74, relevant data concerning the test hardware set-up and recommended useful manual measurements for the test operator to perform.

Figure 8A:
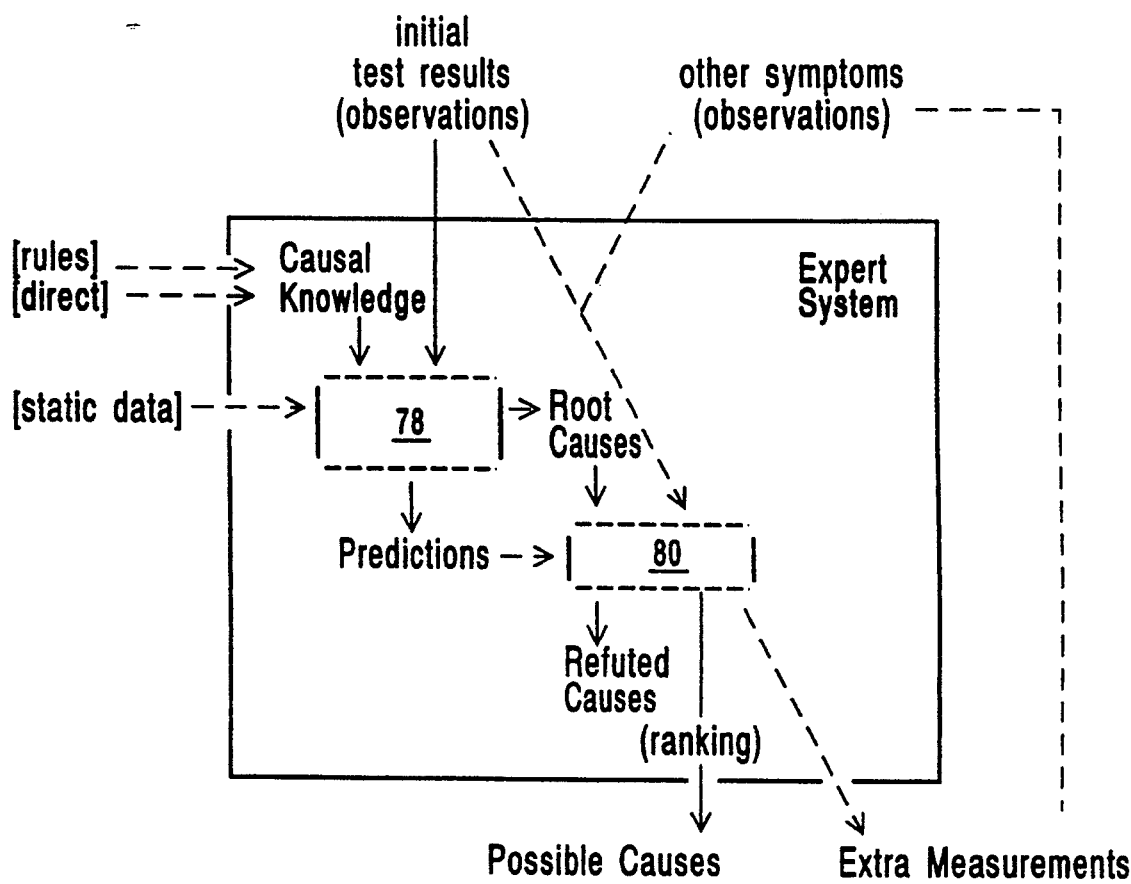
FIG. 8a illustrates the input to and output from the expert system of FIG. 6.

The operation of the expert system 74 will now be more fully described with reference to FIGS. 8A and 8B. The inputs to the expert system 74 are initial test results plus any other test results or observations together with the static data held in the database 62.

The reasoning of the expert system can be divided into the following four processes:
a) generation of root cause hypotheses;
b) predicting test results consistent with the root cause hypotheses of a);
c) checking the consistency of observed test results with current root cause hypotheses;
d) devising extra measurements which are useful for checking the predictions of b).

a) Generation of Root Cause Hypotheses

First a general description will be given.

A failing test triggers the generation of possible root causes by the expert system 74. The inference engine 78 generates possible root causes by applying the generic causal rules in the knowledge base 76 and accessing the static data available. The static data, which is specific to the particular circuit assembly, comprises circuit assembly data held in the database 62 (in FIG. 5), test program data, test set-up data and fixture data generated by the test program generator 64.

In order to generate the possible root causes for a test failure, the expert system 74 takes into account the way a test failed (e.g. fail-high, fail-low, or fail-open), the type of component that is being tested (e.g. resistor, capacitor, diode) and the test set-up that is used for testing the component (e.g. the number of wires used in the measurement, the duration of the test). The test results for other components and the value of other initial observations like noise, are not used during the generation of root cause hypotheses. Each of the components on the circuit assembly has a specific identifier e.g. Resistor 10, and so does each node on the circuit assembly e.g. node 99. The tests also each have an identifier e.g. t_c8 is a test that tests capacitor c8. The root cause hypotheses are instantiated for the specific configuration of the board under test and the component and node identifiers appear in the hypotheses. An example of the process of generating root cause hypotheses is as follows:

There is a test "t_r1" that tests component "r1". r1 is a resistor that has, according to its description in the static data, a value of 4.7 kOhm. t_r1 fails low during testing and the measured value is 4.3 kOhm.

Initial observations:
-observed(test_result(t_r1), fail_low).
-observed(measured_value(t_r1), 4300).

Static data:
-resistor(r1, 4700, 5, 5). % (Device, Value, Tolerance_plus, Tolerance_min)
-test_device(t_r1, r1,resistor) %(Test, Device, Type)
-test_nodes(t_r1, node1, node2,[]) %(Test, S_node, I-Node, G-nodes)

The items following a % sign above are explanatory comments for the preceding items on the same line.

In this example, there are three rules in the knowledge base that can be used to explain the results of a resistor test being fail-low:

(1) test_result(Test fail_low) "CAN BE EXPLAINED BY"
root_cause(low_value(R))
IF
test_device(Test, R, resistor)

(2) test_result(Test, fail_low or fail_high) "CAN BE EXPLAINED BY"
root_cause(wrong_tolerance(R))
IF
test_device(Test, R, resistor)

(3) test_result(Test, fail_low) "CAN BE EXPLAINED BY"
root_cause(intrinsic_resistance(Device))
IF
intrinsic_interaction(Test, Device)

The inference engine 78 uses abduction in applying these rules to generate root cause hypotheses. This means that, given the observed result of a test on resistor r1 failing low, this is evidence to support the plausibility of the three possible causes of that observation although there is no proof. In connection with the third rule, a call is made to the circuit analysis rules which search the circuit assembly topology data to find all devices in which an intrinsic resistance could explain the test failure—suppose that it finds two such devices u1 and u2. As a result the following root cause hypotheses are generated:

C1—root_cause(low_value(r1))
C2—root_cause(wrong_tolerance(r1))
C3—root_cause(intrinsic_resistance(u1))
C4—root_cause(intrinsic_resistance(u2))

These four hypotheses are stored as assumptions in the consistency maintenance module 80.

Figure 8B:
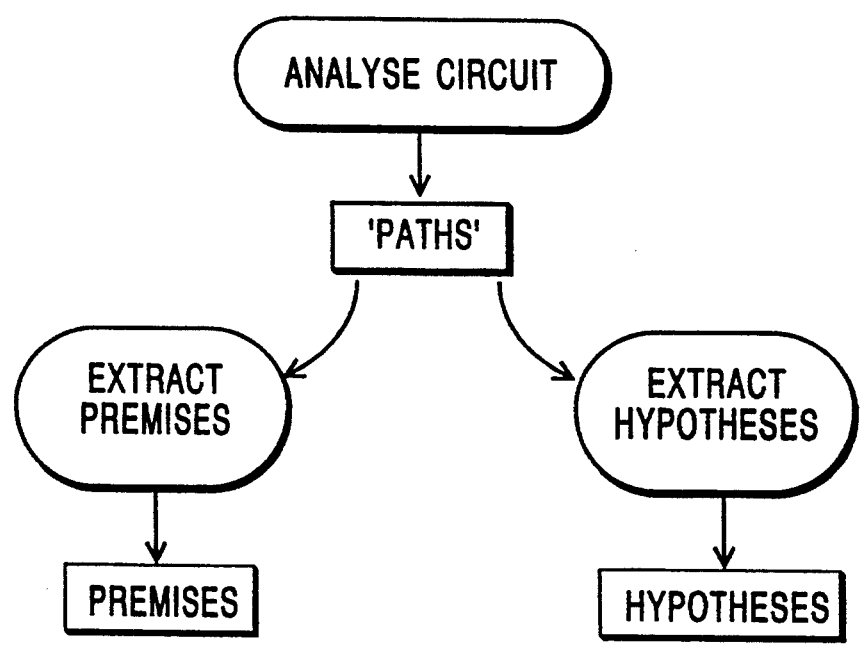
FIG. 8b illustrates the main processing steps in the knowledge.
Figure 9:
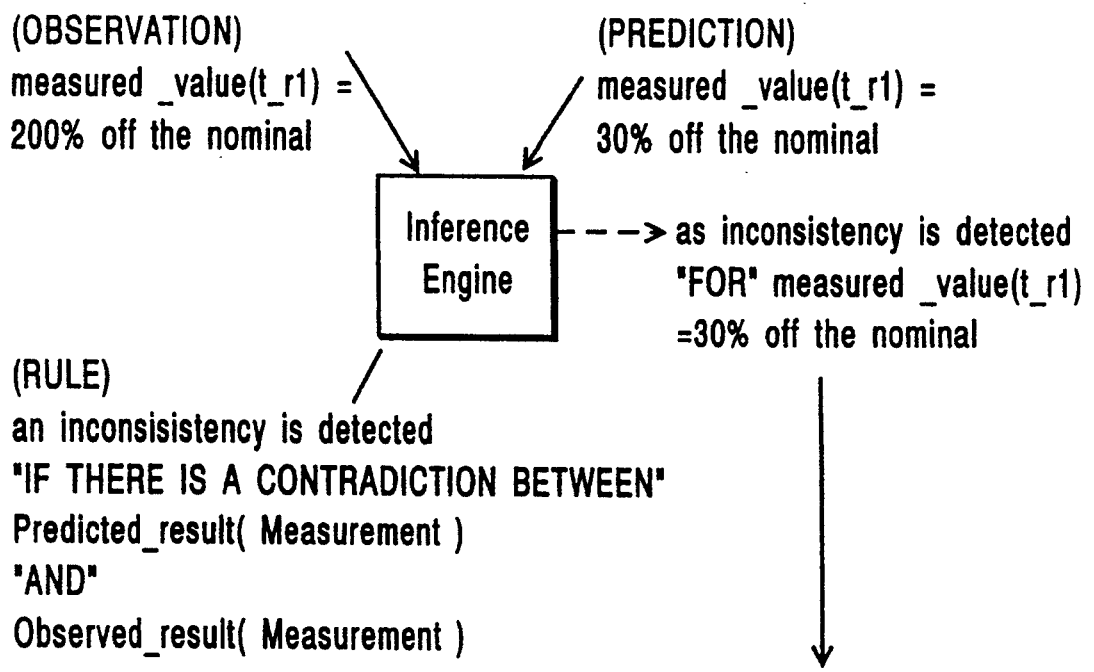
FIG. 9 shows the reputation process carried out by the expert system of FIG. 6.

Referring to FIG. 8B details of the causal model will now be given. The first step for the expert system is to analyse the circuit assembly using the circuit assembly topology data and the initial test results. The circuit analysis rules search for parallel paths present in the circuit assembly and, in particular, for intrinsic capacitances and resistances in the circuit assembly under test. The results of that analysis are stored under the 'paths' name.

Following circuit analysis comes extraction of premises (such as the type of component under test) and root cause hypotheses.

The top-level rule for the generation of hypotheses is:
generate_hypotheses(Test,DUT,resistor,Result,Wires, Hypotheses ,Premises):-
analyse_circuit (Test, resistor, Result, Wires),
extract_premises (Test, resistor, Result, Wires, Premises),
extract_hypotheses (Test, DUT,resistor,Result,Wires,Hypotheses),
where 'DUT' stands for 'device under test'

This rule first calls the 'analyse-circuit' rules which are of the following form:
analyse_circuit (Test, -Component_type, -Test_result, -Number of wires)
finds the parallel paths as appropriate and asserts them in the predicate paths (Test, Path_Type, Paths).

The specific analyse-circuit rules are as follows:
analyse_circuit (Test, resistor, fail_open,-)
analyse_circuit (Test, resistor, fail_high, 2):-
not (parallel_path_expected(Test)).
analyse_circuit (Test, resistor, fail_high, 2):-
parallel_path_expected (Test),
search_paths(Test, s_i_h, S_I Paths),
assert(paths(Test, s_i_h, S_I Paths)).
analyse_circuit (Test, resistor, fail_low, 2):-
search_paths(Test, s_i_l, S_I_Paths),
assert(paths(Test, s_i_l, S_I_Paths)).
analyse_circuit (Test, resistor, fail_high, 3):-
search_paths(Test, s_i_h, S_I_Paths),
assert(paths (Test, s_i_h, S_I_Paths)),
search_paths(Test, s_g, S_G_Paths),
assert(paths(Test, s_g, S_G_Paths)),
search_paths(Test, i_g, I_G_Paths),
assert(paths(Test, i_g, I_G_Paths)).
analyse_circuit(Test, resistor, fail_low, 3):-
search_paths(Test, s_i_l, s_I_Paths),
assert (paths(Test, s_i_l, S_I Paths)),
search_paths(Test, s_g, S_G_Paths),
assert(paths(Test, s_g, S_G_Paths)),
search_paths(Test, i_g, I_G_Paths),
assert(paths(Test, i_g, I_G_Paths)).

The term 'assert' means to supply the results of firing the rule to the 'paths' collection of data.

Premise rules are of the form:
premise(-Test, -Component_type, -Test_results, -Number_of_wires,+Premises)
where '—' indicates an input and '+' indicates the output.

The rules for extracting premises are of the form:
extract_premises(Test, Type, Result, Wires, Premises):-
fast_collect(Prem,premises(Test, Type, Result, Wires, Prem),Premises),
extract_premises(Test, Type, Result, Wires, []).

Rules for extracting premises for the cases of the three wire test failing high and a two wire test failing low are:

3 WIRE, HIGH

```
premise(Test, resistor, fail_high, 3, parallel_with-
    (Dev, Test)):-
  paths(Test, s_i_h, S_I_H_Path),
  collect_inductors_resistors_and_shorts(S_I-
    _H_Path,Ind_Res_Short),
  member (Dev, Ind_Res_Short).
premise(Test,resistor,fail_high,3,zsg_lowering_in-
fluence(Dev,Test)):-
  paths (Test,s_g,S_G_Path),
  collect_inductors_and_resistors(S_G_Path, In-
    d_Res),
  member(Dev, Ind_Res).
premise(Test,resistor,fail_high,3,zig_lowering-
influence(Dev, Test)):-
  paths(Test, i_g, I_G_Path),
  collect_inductors_and_resistors(I_G_Path, In-
    d_Res),
  member (Dev, Ind_Res).
2 WIRES, LOW
premise(Test, resistor, fail_low, 2, parallel_with-
    (Dev, Test)):-
  paths(Test, s_i_l, S_I_L_Path),
  collect_inductors_and_resistors(S_I_L_Path, In-
    d_Res),
  member(Dev, Ind_Res).
premise(Test, resistor,fail_low, 2,parallel_intrinsic-
(I,N1,N2,Test)):-
  paths (Test, s_i_l, S_I_L_Path),
  collect_intrinsics(Test, S-I-L-Path, Intrinsics),
  member((I, N1,N2,-), Intrinsics)
Rules defining root cause hypotheses are of the form:
  might_explain(-Test,-Component_type,-Tes-
    t_result,-Number_of_wires,+Root_cause)
Where again '—' indicates an input and '+' indicates
an output.
Rules for extracting root cause hypotheses are of the
form:
  extract_hypotheses(Test,DUT, Type, Result, Wires,
    Hypotheses):-
    fast_collect (Hypo,
      might_explain(Test,DUT  ,Type,Result,Wires,-
        Hypo),Hypotheses),!.
  extract_hypotheses(Test, DUT, Type, Result,Wires,
    []).
Rules defining root cause hypotheses for the cases of
the three wire test failing high and a two wire test fail-
ing low are:
3 WIRES, HIGH
  might_explain(Test, DUT, resistor,fail_high,3, high-
    _value(DUT)).
  might_explain(Test, DUT, resistor,fail_high,3,-
    wrong_tolerance(DUT)).
  might_explain(Test,DUT,resistor,fail_high,3,wron-
    g_node_data(DUT,Node)):-
    (test_nodes(Test, Node,-,-); test_nodes(test,-,Node,-
    )).
  might_explain(Test,-,resistor  ,fail_high,3,wrong_
    probe_location(Node)):-
    (test_nodes(Test,Node,-,-) ;test_nodes(Test,-,Node,-
    )).
  might_explain(Test,-,resistor  ,fail_high  ,3,bad_
    probe_contact(Node)):-
    (test_nodes(Test,Node,-,-); test_nodes(Test,-,Node,-
    )).
  might_explain(Test,DUT,  resistor,  fail_high,3,ex-
    cessive_trace_res (DUT,Node)):-
    resistor_test_values(Test,Nom,-,-),
    Nom<250,
    (test_nodes(Test,Node,-,-);   test_nodes   (Test,-
    ,Node,))
  might_explain(Test,DUT,resistor,fail_high,3,high-
    _series_r_value(Ind)):-
    paths (Test, s_i_h, S_I_H_Path),
    collect_inductors(S_I_H_Path, Inductors),
    member(Ind, Inductors).
  might_explain(Test,DUT,resistor,fail_high ,3,high-
    _value(Res)):-
    paths(Test,s_i_h,S_I_H_Path),
    collect_resistors(S_I_H_Path, Resistors),
    members(Res, Resistors).
  might_explain(Test,DUT,resistor,fail_high,3,mis-
    sing_component(DUT)).
  might_explain(Test,DUT,resistor,fail_high,3,mis-
    sing_component(Dev)):-
    paths(Test, s_i_h, S_I_H_Path),
    collect_resistors_and_shorts(S_I_H_Path, Res_
    Shorts),
    member(Dev, Res_Shorts).
  might_explain(Test,DUT,resistor,fail_high,3-
    ,low_serives_r_value(Ind)):-
    paths(Test, s_g, S_G_Path),
    collect_inductors(S_G_Path, Inductors),
    member(Ind, Inductors)
  might_explain(Test,DUT,resistor,fail-high,3-
    ,low_value(Res)):-
    paths(Test, s_g, S_G_Path),
    collect_resistors(S_G_Path,Resistors),
    member(Res,Resistors).
  might_explain(Test,DUT,resistor,fail_high,3-
    ,low_series_r_value(Ind)):-
    paths(Test,i_g,I_G_Path),
    collect_inductors(I_G_Path,Inductors),
    member(Ind, Inductors).
  might_explain   (Test,DUT,resistor,fail_high,3-
    ,low_value(Res)):-
    paths(Test,i_g,I_G_Path),
    collect_resistors(I_G_Path, Resistors),
    member(Res, Resistors)
2 WIRES, LOW
  might_explain(Test,DUT,resistor,fail_low,2-
    ,low_value(DUT)).
  might_explain(Test,DUT,resistor,fail_low,2,wron-
    g_tolerance(DUT)).
  might_explain(Test,DUT,resistor,fail_low,2-
    ,low_series_r_value(Ind)):-
    paths(Test, s_i_l, S_I_L_Path),
    collect_inductors(S_I_L_Path, Inductors),
    member(Ind, Inductors)
  might_explain(Test,DUT,resistor,fail_low,2-
    ,low_value(Res)):-
    paths(Test, s_i_l, S_I_L_Path),
    collect_resistors(S_I_L_Path, Resistors),
    member(Res, Resistors).
  might_explain(Test,DUT,resistor,fail_low,2,intrin-
    sic (I,N1,N2,Res)):-
    paths(Test, s_i_l,S_I_L_Path),
    collect_intrinsics(Test,S_I_L_Path, Intrinsics),
    member((I,N1,N2,Res), Intrinsics).
```

In this way the information embodied in the rules of the causal model is utilised to generate root cause hypotheses and associated premises and these are supplied to the consistency naintenance module 80.

Information concerning the frequency of occurence of classes of root causes is also stored in the knowledge base and used at the final output stage to rank the remaining possible root causes. This ranking information is stored in the following form:

root_cause_class(high_value(R),occasional).
root_cause_class(wrong _tolerance(R), occasional).
root_cause_class(wrong_probe_location(Node), rare).
root_cause_class(no_probe_connection(Node), frequent).
root_cause_class(wrong_node_data(R,Node), rare).
root_cause_class(missing_component (R), occasional).
root_cause_class(wrong_component_type(R), rare).
root_cause_class(bad_probe_contact(Node), occasional).
root_cause_class(excessive_trace_res(DUT,-Node), occasional).
root_cause_class(intrinsic(U, N1, N2, Res), frequent).
root_cause_class(low_series_r_value(L), occasional).
root_cause_class(high_series_r_value(L), occasional).
root_cause_class(omitted_parallel_transformer(T), rare).
root_cause_class(bogus_cause(T), rare).

Value definition: The lower the number, the more common a root cause is. 'T' is short for 'Test'
value(frequent, 1).
value(occasional,2).
value(rare,3).
value(never,4).

b) Making Predictions

First, a general description will be given.

The purpose of the prediction—making process is to derive test results which follow on as consequences from each of the hypothesised root causes. A simplifying assumption is made that there is a single fault per failing test. If any such predicted test result is inconsistent with what is in fact observed then the root cause hypothesis/es forming the basis for that predicted test result can be refuted. In logic, if we call the initial failed test result R and the four possible root causes C1-C4 obtained in the general description above A, B, C AND D then we can say four things:

A=>R (i.e. if A is true then so is R, or if A then R)
B=>R
C=>R
D=>R ('modus ponens' rule)

The abduction process has generated four possible root causes as possible explanations for the test result R.

If there are known consequences W, X, Y, Z of root causes A, B, C, D then we can say another four things:
A=>W
B=>X
C=>Y
D=>Z Furthermore, if it can be established that any of the consequences W, X, Y, Z is not in fact true, then the supporting root cause can, by logical deduction, be refuted e.g. not W=>not A ('modus tolens' rule) i.e. if W is not true then neither is A true and the hypothetical root cause A for test result R can be refuted.

The inference engine 78 generates predictions using prediction rules in the knowledge base 76. As an example, let us suppose there are three relevant prediction rules in the knowledge base 76:

(1) measured_value(Test)=a standard resistor value "CAN BE PREDICTED IF"
root_cause(low_value(R))
AND
test_device(Test, R, resistor)

(2) measured_value(Test)<30% off the nominal "CAN BE PREDICTED IF"
root_cause (wrong_tolerance(R))
AND
test_device(Test, R, resistor)

(3) voltage_sensitive(Test)=true "CAN BE PREDICTED IF"
root_cause(intrinsic_resistance(Device))
AND
intrinsic_interaction(Test, Device)

(The third prediction rule is obtained by simplifying assumption that all intrinsic resistances are voltage sensitive)

With only these three rules present the inference engine 78 will, based on the four root causes C1-C4 generated in the previous example, make the following predictions:

P1 - measured_value(t_r1)=a standard resistor value, based on root _cause (low_value(r1))
P2 - measured_value (t_r1)=30% off the nominal based on root_cause(wrong_tolerance(r1))
P3 - voltage_sensitive(t_r1)=true based on root_cause(intrinsic_resistance(u1)) and root_cause(intrinsic_resistance(u2))

This example only shows predictions about the same test (t_r1) as was failing. This is not always the case. Predictions can be made about tests of other components, that are for example neighbours of the component under test or of probes that are used to test the component.

The predictions P1-P3 are stored in the consistency maintenance module 80 which maintains the dependencies between predictions and root cause hypotheses. In this example the dependencies are:
C1=>P1
C2=>P2
C3=>P3
C4=>P3

Rules for generating predicted test results from the causal model will now be given. The supply of root cause hypotheses to the consistency maintenance module 80 causes predication rules in the knowledge base 76 to fire.

The format of a prediction rule is:
f:predict(test_result(Test), <Results>)<-
root_cause(<hypothesis>),
<other_conditions>.

For each of the root cause hypotheses prediction rules are fired to generate predictions based on that hypothesis. The predicted test results may be ones which can be checked against already obtained test results or other information already obtained or may require the carrying out of a further test. Taking the example of a possible root cause of test failure to be that the nominal input value of the device under test (DUT) is wrong i.e. that the value of the DUT in the database 62 is wrong or the value of the DUT in the (supposed known good) circuit assembly is wrong, relevant prediction rules are:

f: predict(test_result(T), fail_high)<-
root_cause(high_value(R)), test—device(T,R,resistor).
f: predict(standard—value(T), [true, possible])<-
root—cause(low—value(R)),
test—device(T,R,resistor),
no—component—directly—parallel(R).
f: predict(standard—value(T), [true, possible])<-
root—cause)high—value(R)),
test—device(T,R,resistor),
no—component—directly—parallel (R),
observed(order—of—magnitude—off(T),N),
N<2.
f: predict(zsi—diff(T), true—higher)<-
root—cause(high—value (R)),
test—device(T,R,resistor),
three—wire(T),
observed(percentage—off(T),X),
X>30.
f: predict (zsi—diff(T), true—lower)<-
root—cause(low—value(R)),
test—device(T,R, resistor),
three—wire (T),
observed (percentage—off(T), X),
X>30.
f: predict (inspect—component(R), low—value)<-
root—cause(low—value(R)).
f: predict(inspect—component(R), high—value)<-
root—cause(High—value(R)).

Another example is when the possible root cause of test failure is that there is a probe in the wrong place on the circuit assembly. Relevant prediction rules are:

f: predict (test—result(T), fail)<-
root—cause(wrong—probe—location(Node)),
s—or—i—node(T, Node).
f: predict (Test—result(T), [pass, fail—low])<-
root—cause(wrong—probe—location(Node)),
g—node(T, Node).
f: predict (pin—check—result(Node), pass)<-
root—cause(wrong—probe—location(Node)).
f: predict (zsi—diff(T), true)<-
root—cause(wrong—probe—location (Node)),
three—wire(T)
s—or—i—node (T, Node).
f: predict (zsg—diff(T), true)<-
root—cause(wrong—probe—location(Node)),
three—wire(T),
s—or—i—node (T, Node).
f: predict(zig—diff(T), true)<-
root—cause (wrong—probe—location(Node)),
three—wire(T),
s—or—i—node (T, Node)
f: predict (verify—node(Node), fail)<-
root—cause(wrong—probe—location(Node).
f: predict(check—device—pin(DUT,Node), fail)<-
root—cause(wrong—probe—location(Node)),
s—or—i—node (T, Node),
test—device(T, DUT,-).
f: predict (check—probe—location(Node), bad—location)<-root—cause(wrong—*probe*—location(Node)).

c) Consistency Checking

When a predicted observation proves to be inconsistent with what is in fact observed, a process of refuting root cause hypotheses is triggered (see FIG. 5). The consistency maintenance module 80 flags refuted root cause hypotheses. As an example, if the following abstraction is made from the initial observation:
measured—value (t—r1)=200% off the nominal this is inconsistent with prediction P2. Hence hypothetical root cause C2 can be refuted. The refutation process can be represented as shown in FIG. 5.

The test results used in maintaining consistency may be those obtained from the initial test run or further tests performed specifically to check root cause hypotheses.

The rule used to derive contradictions between predicted test results and observed test results is:
f: false<-
predict(Obsname, Predicted—result),
observed(Obsname, Observed—result),
contradicting—results(Obsname, Observed—result, Predicted—result).

This rule reads like this: Conclude "false" (which means contradiction/inconsistency) IF for some observation "Obsname" the predicted result "Predicted—result" is contradicting the observed result "Observed—result" for the same observation "Obsname". Contradiction is checked by the predicate contradicting—result.

d) Devising Useful Further Measurements

Useful further measurements are ones for which there is a predicted test result but no actual observation obtained. This means that there remains a possibility of refuting one or more root cause hypotheses. For example, predicted test results:
-measured—value(t—r1)=a standard resistor value
-voltage—sensitive(t—r1)=true Two useful further checks would then be to see whether the measured value of resistor r1 is a standard resistor value and whether the measured resistance is voltage sensitive. Suppose the results are:
-measured—value(t—r1)=a standard resistor value
-voltage—sensitive(t—r1)=FALSE This means that prediction P3 is inconsistent with actual observations and hence that root cause hypotheses C3 and C4 can be refuted. No evidence has been obtained that prediction P1 is inconsistent with the facts which means that root cause hypothesis C1 is the only candidate remaining to explain the test failure. The test diagnosis will therefore be:
root—cause(low—value(r1))

Useful further measurements may be able to be carried out automatically by the system or may be ones which only a human test operator can perform. For extra measurements which can be performed automatically, only one pass is made (as opposed to three cycles of ten passes for the initial tests). All of the known useful automatic extra measurements are made in a single batch as this is more efficient than carrying out extra measurements singly and processing the results individually. Examples of details of extra measurements which can be performed in connection with the present invention are as follows:

1) ac—res—diff(Test)
Allowed values:
false, true, true—pass, true—higher, true—lower, true—open, true—bogus.
Used for:
Many different purposes.
Restrictions:
Performing an AC resistor test should only be done on tests that meet the following requirements:
1) The frequency of the initial test is 0 (DC).
2) The device tested in the initial test is resistive (fet, fuse, jumper, potentiometer, resistor, switch).
Setup:

An AC resistor test is performed with the frequency set at 1024 Hz, with all other options unchanged.

Definition:

The measurement values for this test are the initial measurement value (grand_mean), the extra measurement value, and the expected value. The following results will be returned based on the comparison of the above values:

-true_bogus:
extra measurement was bogus, and the initial measurement was not, probably due to compliance limits or other conditions that cause a test to produce unreliable results.

-true_open:
extra measurement was open, and the initial measurement was not open (as defined in the DATA ABSTRACTION DEFINITIONS section).

-true lower:
the extra measurement test is failing, the extra measurement value is less than the initial measurement value minus 30%, and the extra measurement value does not fall within the range of the expected value plus or minus 30%, or the initial measurement was open and the extra measurement was not.

-true_higher:
the extra measurement test is failing, the extra measurement value is greater than the initial measurement value plus 30%, and the extra measurement value does not fall within the range of the expected value plus or minus 30%.

-true_pass: the extra measurement test is passing.

-true:
the extra measurement test is failing high or low, and the initial measurement was bogus.

false:
the extra measurement test is failing, and the extra measurement value falls within the range of the initial measurement value plus or minus 30% or the extra measurement value falls within the range of the expected value plus or minus 30%.

2) extra_wait_diff(Test)

Allowed values:
false, true, true_pass, true_higher, true_lower, true_open, true_bogus.

Used for:
To detect the presents of capacitances in the SI leg of a measurement, or the S or I legs of the measurement delta if guarded.

Restrictions:
Adding an extra wait time to a device test should only be done on tests where the frequency of the initial test is 0 (DC).

Setup:
The original measurement is taken with the wait option set to 1 second, with all other options unchanged.

Definition:
The measurement values for this test are the initial measurement value (grand_mean), the upper and lower test limits of the device, and the extra measurement value. The formula that is used to define the difference between a false result and a true_lower or true_higher is:

M_init>T_limit+
Limit-=[(0.75*M init)+(0.25*T limit+)]
Limit+=[(2* M_init)-L_value-]
M init<T Limit-
Limit+=[(0.75*M init)+(0.25*T_limit-)]Limit-=[(2* M_init)-L_value+]

where:
Limit+=upper limit
Limit-=Lower Limit
M init=initial measurement value (grand_mean)
T_limit+=test upper limit
T_limit-=test lower limit The following results will be returned based on the comparison of the above values:

-true_bogus:
extra measurement was bogus, and the initial measurement was not, probably due to compliance limits or other conditions that cause a test to produce unreliable results.

-true_open: extra measurement was open, and the initial measurement was not open (as defined in the DATA ABSTRACTION DEFINITIONS section).

-true lower:
the extra measurement test is failing, the extra measurement value is less than the tower limit (Limit-) and the extra measurement value is greater than the test upper limit (T_limit+).

-true_higher: the extra measurement test is failing, the extra measurement value is greater than the upper limit (Limit+), and the extra measurement value is less than the test lower limit (T_limit-).

-true_pass: the extra measurement test is passing.

true:
the extra measurement test is failing, and if M init->T_limit+, the extra measurement value is greater than the upper limit (Limit+) or Less than the test lower limit (T_limit-); else if M inst<T_limit-, the extra measurement value is less than the lower limit (Limit-) or greater than the test upper limit (T_limit+).

false:
the extra measurement test is failing, and the extra measurement value falls within the range of the tower limit (Limit-) and the upper limit (Limit+).

3 )reactance_diff(Test)

Allowed values:
false, true, true_pass, true_higher, true_lower, true_open, true_bogus.

Used for:
Many different purposes.

Restrictions:
Performing an AC capacitor test should only be done on tests that meet the following requirements:
1) The frequency of the initial test is 0 (DC).
The device tested in the initial test is resistive (fet, fuse, jumper, potentiometer, resistor, switch).

Setup:
Three AC capacitor tests are performed with the frequency set at 1024 Hz, with all other options unchanged except for the reference resistor.
The first test uses 're1', the second test uses 're3', and the third test uses 're5'

Definition:
The measurement values for this test are the initial measurement value (grand_mean), the extra measurement value, and the expected value (the last two values are taken from the test with the highest reference resistor that is not bogus). The following results will be returned based on the comparison of the above values:

-true_bogus:

one or more of the extra measurements was bogus, and the initial measurement was not, probably due to compliance limits or other conditions that cause a test to produce unreliable results.

-true_open:

one or more of the extra measurements was open, and the initial measurement was not open (as defined in the DATA ABSTRACTION DEFINITIONS section).

-true_lower: the extra measurement test is failing, the extra measurement value is less than the initial measurement value minus 30%, and the extra measurement value does not fall within the range of the expected value plus or minus 30%.

-true_higher: the extra measurement tests are failing, the extra measurement value is greater than the initial measurement value plus 30%, and the extra measurement value does not fall within the range of the expected value plus or minus 30%.

-true_pass: the extra measurement test is passing.

-true: the extra measurement test is failing high or low, and the initial measurement was bogus.

-false: the extra measurement test is failing, and the extra measurement value falls within the range of the initial measurement value plus or minus 30% or the extra measurement value falls within the range of the expected value plus or minus 30%.

4 swap_s_i_diff(Test)

Allowed values:

false, true_pass, true_higher, true_lower, true_open, true_bogus.

Used for:

To determine if swapping the S and I busses reduces the noise on a noisy measurement.

Restrictions:

Swapping the S and I busses for a test should only be done on tests that meet the following requirements:
1) The test must have ordinary noise and not have a mean shift (the measured value must tie within the test limits).
2) For unguarded cases:
if resistive, the value must be greater than 100k ohms
if capacitive, the value must be less than 1000 p farads
3) Either both the A and B busses are used or neither the A or B busses are used. The swap S and I will not work if only one of the busses is assigned.

Setup:

The S and I leads of the device under test are reversed and 10 readings are taken (since this is a noisy test).

Definition:

The measurement values for this test are sigma (standard_deviation). The following results wilt be returned based on the comparison of the sigmas:

-true_bogus: one or more of the extra measurements was bogus.

-true_open:

one or more of the extra measurements was open (as defined in the DATA ABSTRACTION DEFINITIONS section).

-true_lower: the extra measurement tests are failing, and the extra measurement sigma is at least 2 times smaller than the initial measurement sigma.

-true_higher: the extra measurement tests are failing, and the extra measurement sigma is at least 2 times greater than the initial measurement sigma.

-true_pass: the extra measurement tests are passing.

-false: the extra measurement tests are failing, and the extra measurement sigma is less 2 times smaller than the initial measurement sigma.

5 voltage_sensitive(Test)

Allowed values:

false, true, true_bogus.

Used for:

check for active devices in parallel with the tested device.

Restrictions:

Performing a voltage sensitive test should only be done on tests that meet the following requirements:
1) The frequency of the initial test is 0 (DC).
2) The device tested in the initial test is resistive (fet, fuse. jumper, potentiometer, resistor, switch).

Setup:

Two measurements are taken. The first measurement is taken with the amplitude set to 0.1 volts, and the second measurement is taken with amplitude set to 0.2 volts, with all other options unchanged.

Definition:

The measurement values for this test are the first and second extra measurement values, and the first and second expected measurement values. These values are used to calculate the two difference current values flowing through the intrinsic device, the first intrinsic current value with the amplitude set to 0.1 volts, and the second intrinsic current value with the amplitude set to 0.2 volts. The results will be returned based on the comparison of the above intrinsic current values:

true_bogus:

one or both of the extra measurements was bogus, or one or both of the expected measurements was bogus, probably due to compliance limits or other conditions that cause a test to produce unreliable results.

true: the second intrinsic current value is greater than seven times the first intrinsic current value.

false: the second intrinsic current value is less than seven times the first intrinsic current value.

6) zsi_diff(Test)

zsg_diff(Test)

zig_diff(Test)

Allowed values:

false, true_higher, true_lower, true_open, true_bogus.

Used for:

To determine if the actual measured values of the delta leads of a guarded device agrees with the predicted results.

Restrictions:

The tests zsg_diff and zig_diff can only be requested if the device is guarded.

Setup:

Three DC resistor tests are performed for a non-guarded device, and nine DC resistor tests are performed for a guarded test. All other options remain unchanged except for the following options:

| | |
|---|---|
| sa | removed |
| sb | removed |

-continued

| | |
|---|---|
| sl | removed |
| wa | set to 1 second |
| ar | set to 20 mV |
| re1 | first measurment |
| re3 | second measurement |
| re5 | third measurement |

To measure zsi, the guard connections, if guarded are removed. To measure zsg, the guard connections are tied to the I bus internally. To measure zig, the S and I connections are reversed and the guard connections are again tied to the I bus internally.

Definition:
The measurement values for this test are the extra measurement value, and the expected value (both values are taken from the test with the highest reference resistor that is not bogus). The following results will be returned based on the comparison of the above values:

-true_bogus:
all three extra measurements were bogus or all three expected values were bogus, probably due to compliance limits or other conditions that cause a test to produce unreliable results.

-true_open: all three extra measurements were open or all three expected values were open (as defined in the DATA ABSTRACTION DEFINITIONS section).

-true_lower: the extra measurement value is less than expected value minus 20% plus 3 ohms.

-true_higher: the extra measurement value is greater than expected value plus 20% plus 3 ohms.

-false: the extra measurement value falls within the range of the expected value plus or minus 20% plus 3 ohms.

7) expected_rsi(Test) expected_rsg(Test) expected_rig(Test)

Allowed value:
real.
Used for:
To check for the presence of guard lead resistance in a guarded circuit.
Restrictions:
The extra measurements expected_rsg and expected_rig can only be requested if the device is guarded.
Setup:
None, this is purely a simulated calculation.
Definition:
The values returned are calculated from simulated measurements.

The test operator can operate the system in three modes concerning the desired output. The system generates a debug report and the user can choose between the following options.

i) simply receiving the debug report;
ii) receiving the debug report and having the opportunity to verify the findings of the system at which point the system automatically applies fixes;
iii) receiving the debug report and the system automatically applying fixes without waiting for verification of the findings in the report.

The debug report contains a list of possible root causes, ordered by probability and also includes a list of root causes which have been refuted by the expert system. In addition, there is a list of manual extra measurements which it would be useful for the test operator to perform in order to refute remaining possible root causes.

Two examples of such debug reports are as follows:
1) resistor r2wr10 has failed open
    Board data:
        resistor(r2wr10, 1000.0, 1.0, 1.0, fixed)
        device(r2wr1, [gnd, r2wn1_1])
    Testprogram data:
        S node: r2wn10-1
        I node: r2wn10_2
        test values: 1000.0, 2.31, 1.34
        options: [pm, wb, am(0.1), ar(0.1), re(3)]
    Initial observations:
        fail open: no other initial observations
    Possible Root Causes:
        1: no_probe_connection(r2wn10_2)
        2: wrong_node_data(r2wr10, r2wn10_1)
        3: wrong_node_data_(r2wr10, r2wn10_2)
    Refuted Root Causes:
        no_probe_connection(r2wn10_1) refuted by predict(pin_check_result(r2wn10_1), fail)
        missing_component(r2wr10) refuted by predict-(pin_check_result(r2wn10_1), fail)
        wrong_component_type(r2wr10) refuted by predict(pin_check_result(r2wn10_1), fail)
    Useful manual measurements:
        1: check_device_pin(r2wr10, r2wn10_1)
        2: verify_node(r2wn10_1)
        3: check_device_pin(rwr10, r2wn10_2)
        4: verify_node(r2wn10_2)

2) resistor r3wr102_2 has failed high
    Board data:
        resistor(r3wr102_2, 100.0, 1.0, 1.0, fixed)
        device(r2wr1, [gnd, r2wn1_1])
    Testprogram data:
        S node: r3wn102_3
        I node: r3wn102_2
        G nodes: [r3wn102_1]
        test values: 105.0, 3.78, 2.89
        options: [pm, am(0.1), ar(0.1), re(2)]
    Initial Observations:
        average measured value: 117.16424
        standard deviation: 0.049683665
        measured range: [116.1195, 117.9778]
        percentage off nominal: 11.088
        order of magnitude off: 0
        noisy measurement: false
        probe noise present: false
        measured value is standard resistor value: false
    Possible Root Causes:
        1: high_value(r3wr102_2)
        2: wrong tolerance(r3wr102_2)
        3: excessive_trace_res(r3wr102_2, r3wn102_3)
        4: excessive_trace_res(r3wr102_2, r3wn102_2)
        5: low_value(r3wr102_1)
        6: low_value(r3wr102)
    Refuted Root Causes:
        wrong_node_data(r3wr102_2, r3wn102_3) refuted by predict(pin_check_result(r2wn-10_1), fail)
        wrong_node_data(r3wr102_2, r3wn102_2) refuted by predict(pin_check_result(r2wn-10_1), fail)
        wrong_probe_location(r3wn102_3) refuted by predict (pin check result(r2wn10_1), fail)

wrong probe 1location(r3wn102_2) refuted by
  predict(pin_check_result(r2wn10_1), fail)
bad probe contact(r3wn102_3) refuted by predict(pin_check_result(r2wn10_1), fail
bad_probe_contact(r3wn102_2) refuted by
  predict(pin_check_result(r2wn10_1), fail)
missing component(r3wr102_2) refuted by predict(pin_check_result(r2wn10-1), fail)
Useful manual measurements:
  1: inspect_component(r3wr102)
  2: inspect_component(r3wr102_1)
  3: measure_trace_resistance(r3wr102_2, r3wn102_2)
  4: check_device_pin(r3wr102, r3wn102_2)
  5: verify_node(r3wn102_2)
  6: measure_trace_resistance(r3wr102_2, r3wn102_3)
  7: check_device_pin(r3wr102_2, r3wn102_3)
  8: verify_node(r3wn102_3)
  9: inspect_component(rwr102_2)

The possible root causes are arranged in order in the debug report with the generally most frequently occurring root cause (and therefore the most likely one) at the top of the list. If two or more of the possible root causes have the same frequency ranking these are output together in the list of possible root causes and in no particular order.

The test operator carries out the suggested manual tests in order to refute or verify the possible root causes listed in the debug report. If the result is one possible root cause then the next step is to apply the appropriate fix or repair to remove that root cause. If more than one root cause remains a possibility the test operator can either:

i) try to devise further manual tests to refute certain possible root causes;
ii) apply the appropriate fix or repair for the most likely root cause and run a further test to see if that removes the problem and, if not, continue down the list of possible root causes;
iii) decide to accept that there is truly more than one root cause for that particular test failure and proceed to apply the appropriate fixes or repairs for each of the possible root causes.

A fix is a change to the test program and is generally quicker and easier to make than a repair. An example of possible generic root causes and the corresponding fixes and repairs is shown below:

| root cause: | fix: | repair: |
| --- | --- | --- |
| low_value(R) | change nominal value in test program | change nominal value in board database |
| high_value(R) | change nominal value in test program | change nominal value in board database |
| wrong_tolerance(R) | change nominal value in test program | change nominal value in board database |
| wrong_probe_location(Node) | comment test | change probe position in board_xy database and change probe in fixture |
| missing_component(R) | change nominal value in test program | change nominal value in board database |
| wrong_component_type(R) | write manual test program | update board database |
| bad_probe_contact(Node) | change nominal | repair fixture |

| root cause: | fix: | repair: |
| --- | --- | --- |
| intrinsic(U, N1, N2) | value and tolerance in test program change nominal value and tolerance in test program | insert non-testable component in board database |

The present invention provides for the identification of the root cause of a test failure in a circuit assembly test system thereby facilitating the removal of the root causes which leads to the development of a better quality set of tests and greater harmonization between the data describing the circuit assembly and the hardware test set-up. The present invention enables a test operator to be more efficient and effective and shortens significantly the time taken to debug a circuit assembly test system.

Whilst the specific embodiment which is described above as the best mode of the present invention relates to the debugging of systems for in-circuit testing of circuit boards comprising analogue components, the present invention is readily applicable to debugging systems for carrying out other forms of circuit testing, as will be appreciated by a person skilled in the art.

Furthermore, the present invention is also readily applicable to the task of diagnosing faults in circuit assemblies. For the purposes of the diagnosis of faults in circuit assemblies, it is assumed that the test system has been fully debugged and is fault-free.

The rules forming the causal model of the knowledge base are written based on that assumption. All of the root cause hypotheses generated by the system then concern possible faults in the circuit assembly or in the way it has been positioned for testing.

We claim:

1. Apparatus for testing circuit assemblies comprising:
   means for storing data relating to a topology of a circuit assembly;
   means for storing testing data for said circuit assembly;
   means for performing tests on said circuit assembly in accordance with said testing data and storing test results therefrom; means for generating and storing possible causes of test failures based, at least in part, on the stored topology;
   means for predicting test results which can be caused by said possible causes of test failures;
   logic means for detecting inconsistencies between observed test results and predicted test results, and
   means responsive to detected inconsistencies from said logic means for indicating possible causes of test failure which are consistent with said observed test results.

2. Apparatus according to claim 1 further comprising:
   means for ranking possible causes of test failures according to their relative probabilities.

3. Apparatus according to claim 1 further comprising:
   means for automatically effecting a change to data and/or steps used to test the circuit assembly in order to remove a possible cause of test failure.

4. Apparatus according to claim 1 further comprising:
   means for devising further tests for evaluating said predicted test results, and means for performing one or more of said further tests wherein said logic means is operable to eliminate ones of said stored possible causes of test failure which are not consistent with results of said further tests.

5. Apparatus according to claim 4, further comprising:

means for carrying out at least one of said further tests automatically.

6. Apparatus according to claim 4, further comprising:

means for indicating to a user at least one further test to be carried out manually, and means for enabling a user to input a manual test result.

7. An expert system for use with circuit assembly test equipment, said equipment comprising:

means for storing data relating to a topology of a circuit assembly;

means for performing tests on said circuit assembly and storing test results, said expert system comprising;

means for generating and storing possible causes of test failures based, at least in part, on the stored topology;

means for predicting and storing test results which can be caused by said possible causes of test failures; and logic means for determining if stored test results are consistent with predicted test results, and indicating possible causes of test failure which are consistent with said stored test results.

8. An expert system according to claim 7, further comprising:

means for devising further tests for evaluating said predicted test results and means for storing the results of said further tests wherein said logic means is operable to eliminate ones of said possible causes of test failure which are not consistent with the results of said further tests.

9. An expert system according to claim 7 further comprising:

means for ranking possible causes of test failures according to their relative probabilities.

10. A method of testing circuit assemblies using a computerized system for testing circuit assemblies comprising means for storing data relating to the topology of a circuit assembly and means for storing testing data, said method comprising the following steps:

a) performing tests on said circuit assembly and storing test results;

b) generating and storing possible causes of test failures;

c) predicting and storing predicted test results which can be caused by said possible causes of test failure;

d) determining consistency between stored test results of said circuit assembly and said predicted test results, and e) indicating possible causes of test failure which are consistent with said stored test results of said circuit assembly.

11. A method according to claim 10 comprising the further step of:

automatically effecting a change to data and/or steps used to test the circuit assembly in order to remove a possible cause of test failure.

12. A method according to claim 10 further comprising the steps of;

a) devising further tests for evaluating said predicted test results assuming said possible causes;

b) performing one or more of said further tests;

c) eliminating ones of stored possible causes of test failure which are not consistent with the results of said further tests.

13. A method according to claim 12 comprising the further step of:

carrying out at least one of said further tests automatically.

14. A method according to claim 12 comprising the further step of:

carrying out at least one of said further tests manually and inputting the manual test results to the computerized system.

15. A method according to claim 12 comprising the further step of:

ranking possible causes of test failures according to their relative probabilities.

* * * * *